(12) United States Patent
Agarwal et al.

(10) Patent No.: US 11,984,849 B2
(45) Date of Patent: May 14, 2024

(54) SWITCHOVER SCHEMES FOR TRANSITION OF OSCILLATOR FROM INTERNAL-RESISTOR TO EXTERNAL-RESISTOR MODE

(71) Applicant: TEXAS INSTRUMENTS INCORPORATED, Dallas, TX (US)

(72) Inventors: Nitin Agarwal, Bangalore (IN); Aniruddha Roy, Bangalore (IN); Preetham Narayana Reddy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/903,128

(22) Filed: Sep. 6, 2022

(65) Prior Publication Data

US 2023/0043133 A1 Feb. 9, 2023

Related U.S. Application Data

(63) Continuation of application No. 17/510,032, filed on Oct. 25, 2021, now Pat. No. 11,437,955.

(30) Foreign Application Priority Data

Aug. 5, 2021 (IN) .............................. 202141035219

(51) Int. Cl.
*H03B 5/06* (2006.01)
*H03B 5/12* (2006.01)
(Continued)

(52) U.S. Cl.
CPC ............. *H03B 5/06* (2013.01); *H03B 5/1212* (2013.01); *H03B 5/36* (2013.01); *H03L 5/00* (2013.01)

(58) Field of Classification Search
CPC .......... H03B 5/06; H03B 5/1212; H03B 5/36; H03L 5/00; H03K 3/0231
(Continued)

(56) References Cited

U.S. PATENT DOCUMENTS 6,020,792 A 2/2000 Nolan et al.
6,870,433 B2 * 3/2005 Motz ...................... H03K 3/354
331/111
(Continued)

OTHER PUBLICATIONS

Common Problems in the Design of Digital Oscillators and Their Remedy, by Norm Looper, Nuts and Volts, Everything for Electronics. Part 1. (Year: 2008).*
(Continued)

*Primary Examiner* — Arnold M Kinkead
(74) *Attorney, Agent, or Firm* — Brian D. Graham; Frank D. Cimino

(57) ABSTRACT

In an example, a system includes an oscillator circuit on a chip. The oscillator circuit includes a charging current generator including a current mirror and an amplifier, where the amplifier is coupled to a pin of the chip. The oscillator circuit also includes a first switch coupled to the pin, a second switch coupled to the pin and to a charging resistor, and a third switch coupled to the amplifier and an internal resistor, where the internal resistor is internal to the chip. The oscillator circuit includes a bias current source coupled to the current mirror. The system includes an external resistor coupled to the pin, where the external resistor is external to the chip. The system also includes an external capacitor coupled to the pin and coupled in parallel to the external resistor, where the external capacitor is external to the chip.

20 Claims, 10 Drawing Sheets

(51) Int. Cl.
*H03B 5/36* (2006.01)
*H03L 5/00* (2006.01)

(58) Field of Classification Search
USPC .................. 331/185, 135, 117 FE, 111, 143
See application file for complete search history.

(56) References Cited

U.S. PATENT DOCUMENTS

| | | |
|---|---|---|
| 7,034,627 B1 | 4/2006 | Kudari |
| 7,332,944 B2 | 2/2008 | Fujita et al. |
| 7,385,453 B2 * | 6/2008 | Nervegna ............... H03K 3/011 331/177 V |
| 9,520,881 B1 | 12/2016 | Das et al. |
| 10,666,235 B1 | 5/2020 | Chou et al. |
| 11,329,606 B1 | 5/2022 | Cao et al. |
| 11,437,955 B1 | 9/2022 | Agarwal et al. |
| 2006/0097813 A1 | 5/2006 | Won |
| 2006/0126238 A1 | 6/2006 | Goudo |
| 2007/0146087 A1 | 6/2007 | Hwang et al. |
| 2007/0233912 A1 | 10/2007 | Piasecki et al. |
| 2008/0136492 A1 | 6/2008 | Hu |
| 2008/0180151 A1 | 7/2008 | Gong et al. |
| 2014/0062610 A1 | 3/2014 | Ito et al. |
| 2015/0214934 A1 | 7/2015 | Luan et al. |
| 2016/0254817 A1 | 9/2016 | Far et al. |
| 2017/0104475 A1 | 4/2017 | Lam |
| 2017/0279454 A1 | 9/2017 | Li |
| 2019/0013779 A1 | 1/2019 | Jin et al. |
| 2019/0149140 A1 | 5/2019 | Han et al. |
| 2019/0319611 A1 | 10/2019 | Sim et al. |
| 2020/0014372 A1 | 1/2020 | Narwal et al. |

OTHER PUBLICATIONS

Non-Final Office Action dated Jun. 10, 2022, U.S. Appl. No. 17/509,706, filed Oct. 25, 2021, 13 pages.
Final Office Action dated Nov. 18, 2022, U.S. Appl. No. 17/509,706, filed Oct. 25, 2021, 10 pages.
Non-Final Office Action dated Nov. 4, 2022, U.S. Appl. No. 17/509,836, filed Oct. 25, 2021, 8 pages.
Notice of Allowance dated May 22, 2023, U.S. Appl. No. 17/509,836, filed Oct. 25, 2021, 7 pages.

* cited by examiner

SWITCHOVER SCHEMES FOR TRANSITION OF OSCILLATOR FROM INTERNAL-RESISTOR TO EXTERNAL-RESISTOR MODE

CROSS-REFERENCE TO RELATED APPLICATIONS

The present application is a continuation of and claims priority to U.S. patent application Ser. No. 17/510,032, which was filed Oct. 25, 2021, which claims priority to Indian Provisional Patent Application No. 202141035219, which was filed Aug. 5, 2021, titled "Switchover Schemes for Transition of Oscillator from Internal-R to External-R Mode," each of which is hereby incorporated herein by reference in its entirety.

BACKGROUND

Oscillators generate clock signals for microcontrollers and other electronic devices. Oscillators produce a repeating and alternating waveform that may be used for a variety of applications. Oscillators may be located within an electronic chip, with some components on-chip and some components off-chip. The accuracy of the oscillator may vary based on the structure of the oscillator and the components that make up the oscillator.

SUMMARY

In accordance with at least one example of the description, a system includes an oscillator circuit on a chip. The oscillator circuit includes a charging current generator including a current mirror and an amplifier, where the amplifier is coupled to a pin on the chip, and where the pin is adapted to be coupled to circuitry external to the chip. The oscillator circuit also includes a first switch coupled to the pin, a second switch coupled to the pin and to a charging resistor, and a third switch coupled to the amplifier and an internal resistor, where the internal resistor is internal to the chip. The oscillator circuit includes a bias current source coupled to the current mirror.

In accordance with at least one example of the description, a system includes an oscillator circuit on a chip. The oscillator circuit includes a charging current generator including a current mirror and an amplifier, where the amplifier is coupled to a pin of the chip. The oscillator circuit also includes a first switch coupled to the pin, a second switch coupled to the pin and to a charging resistor, and a third switch coupled to the amplifier and an internal resistor, where the internal resistor is internal to the chip. The oscillator circuit includes a bias current source coupled to the current mirror. The system includes an external resistor coupled to the pin, where the external resistor is external to the chip. The system also includes an external capacitor coupled to the pin and coupled in parallel to the external resistor, where the external capacitor is external to the chip.

In accordance with at least one example of the description, a method includes charging an external capacitor coupled to a pin on an oscillator chip, where the external capacitor is external to the chip. The method also includes providing a bias current to a current mirror with a bias current source. The method includes disconnecting an internal resistor of the oscillator chip and connecting an external resistor to the oscillator chip, where the internal resistor is internal to the chip, and where the external resistor is external to the chip and coupled to the pin. The method also includes, responsive to connecting the external resistor, charging the external capacitor to a predetermined value. The method includes responsive to charging the external capacitor to the predetermined value, disconnecting the bias current source from the current mirror.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
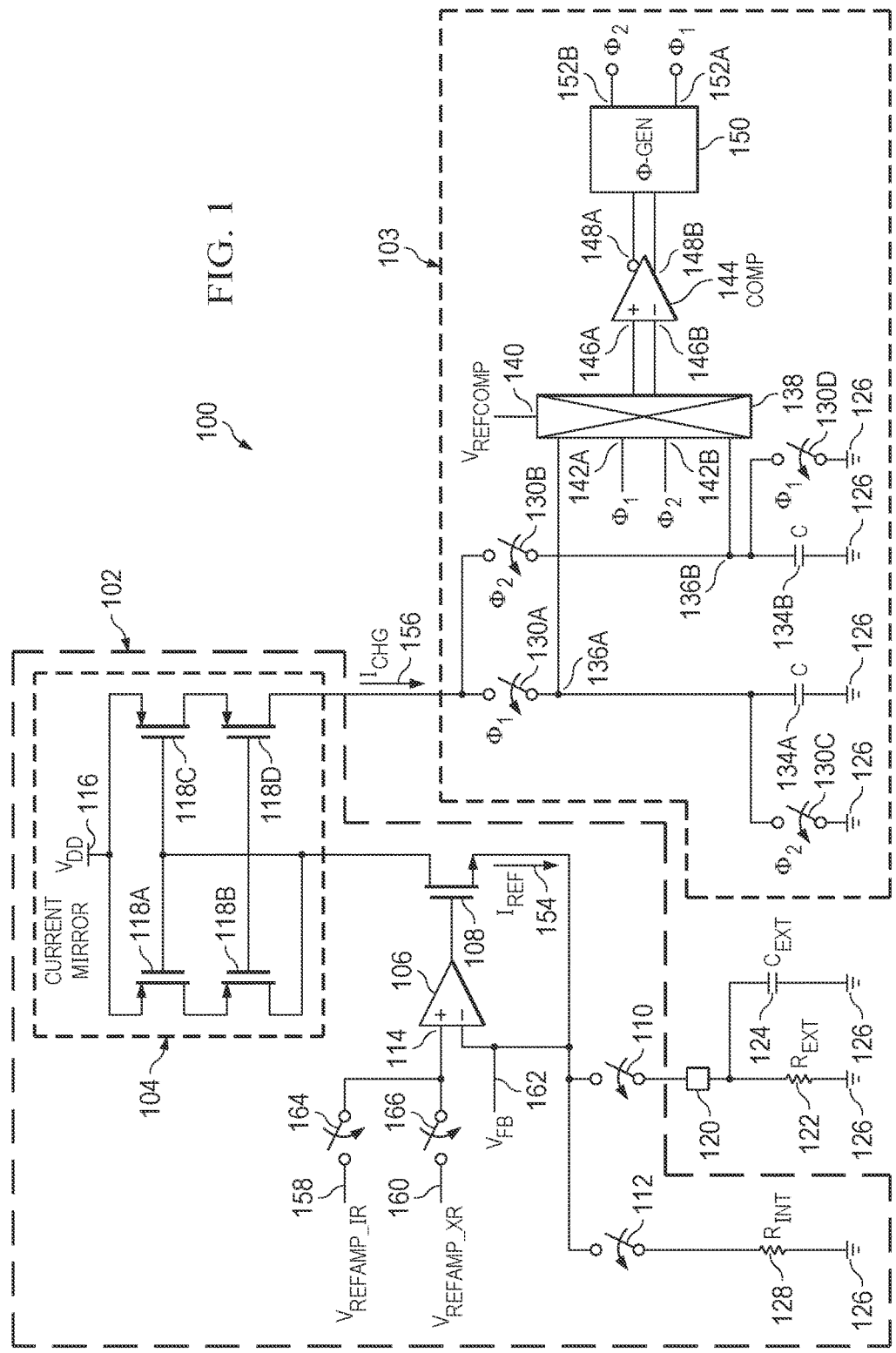
FIG. 1 is a circuit diagram of a system for an oscillator with an internal-resistor mode and an external-resistor mode in accordance with various examples.

Some oscillators have circuit components on an electronic chip (on-chip), while other oscillators have some circuit components located off the chip (off-chip). If an oscillator chip has on-chip resistor components, the resistor components may have a temperature-dependent, non-linear variation. The resistor values may also drift over time. Due to these variations and other factors, an oscillator chip with on-chip resistor components may not be able to achieve accuracy of its frequency within 1% of a target frequency. An off-chip resistor, coupled to the oscillator chip, may provide greater accuracy. In examples herein, "off-chip" is synonymous with the term "external." Also, "on-chip" is synonymous with the term "internal."

An oscillator may include an external resistor but also have an internal-resistor mode. The internal resistor mode uses a resistor that is internal to the chip. The external-resistor mode uses a resistor that is external to the chip. Some users may prefer the internal-resistor mode if the greater accuracy of the external-resistor mode is not needed, or to save costs. Therefore, an oscillator chip may include both modes. It may be beneficial to start up the oscillator in internal-resistor mode (e.g., for faster startup) and then switch to external-resistor mode if external-resistor mode is to be used.

An external capacitor may be located in parallel across the external resistor to provide filtering for noise on the pin of the chip that is coupled to the external resistor. The external capacitor has a voltage across it during operation, but may not have a voltage across it at the time the system switches to external-resistor mode. Therefore, when the oscillator switches from internal-resistor mode to external-resistor mode, the capacitor has to charge. During the transition from internal-resistor mode to external-resistor mode, the oscillator frequency is not well controlled. The charging current for the capacitor could increase significantly. A high oscillator frequency could cause a system failure. If the capacitor has a voltage across it when the external resistor is connected to enter external-resistor mode, the charging current could fall to a low value. If this happens, the oscillator frequency could also fall to a low value or even stop oscillating. Any circuitry that depends on a clock signal produced by the oscillator may not operate properly during or after the transition.

In examples herein, a three-phase transition is performed to switch the oscillator from internal-resistor mode to external-resistor mode. In the first phase, the external capacitor is charged with the internal resistor connected and the external resistor disconnected. A bias current source charges the oscillator circuitry to isolate the oscillator from the transition to external-resistor mode.

In the second phase, the internal resistor is disconnected and the external resistor is connected. An operational amplifier stabilizes a voltage at a pin on the chip that is coupled to the external resistor. After this voltage reaches a predetermined value, the transition enters the third phase.

In the third phase, the bias current source is disconnected from the oscillator and a current mirror is connected to the oscillator circuitry. The transition is then complete and the system is operating in external-resistor mode. The three-phase transition provides a controlled transition that reduces the sharp increase or decrease in the oscillator frequency during the transition, which reduces the possibility of a system failure.

In a different example, a push-pull amplifier rapidly increases the voltage across the capacitor. During the transition from internal-resistor mode to external-resistor mode, the push-pull amplifier increases the voltage across the capacitor during the first phase described above. A voltage offset at the input of the push-pull amplifier is useful for automatically turning off the push-pull amplifier at the appropriate time, after the capacitor is at least partially charged. Turning off the push-pull amplifier if it is not in use reduces leakage current. In another example, the voltage offset is produced by different sizing of the transistors within the push-pull amplifier.

FIG. 1 is a circuit diagram of a system 100 having an oscillator with an internal-resistor mode and an external-resistor mode in accordance with various examples herein. System 100 includes a charging current generator 102 that generates charging current used by oscillator circuitry 103. Charging current generator 102 includes a current mirror 104, an amplifier 106, a transistor 108, switch 110, switch 112, and input 114 to amplifier 106. Current mirror 104 is coupled to voltage node 116 ($V_{dd}$) and includes transistors 118A, 118B, 118C, and 118D (collectively, transistors 118).

Oscillator circuitry 103 includes the components shown within the dashed box in this example. In some examples, other components may be included within oscillator circuitry 103. In other examples, some of the components shown within oscillator circuitry 103 may be outside of oscillator circuitry 103. In some examples herein, components within charging current generator 102 and oscillator circuitry 103 may be inside an oscillator chip, while other components are external to the chip.

System 100 includes node 120, which is a pin of an oscillator chip that is configured to couple to external components. In this example, node 120 is coupled to external resistor $R_{EXT}$ 122 and external capacitor $C_{EXT}$ 124. External resistor $R_{EXT}$ 122 and external capacitor $C_{EXT}$ 124 are coupled to ground 126.

System 100 also includes internal resistor $R_{INT}$ 128 in the charging current generator 102, switches 130A, 130B, 130C, and 130D (collectively, switches 130), and capacitors 134A and 134B (collectively, capacitors 134). System 100 includes node 136A and node 136B, block 138, input node 140 (coupled to a voltage source that provides a voltage $V_{REFCOMP}$), input nodes 142A and 142B, and comparator 144. Comparator 144 includes first input 146A and second input 146B. Comparator 144 includes first output 148A and second output 148B. System 100 also includes phase generator 150, which has a first output 152A and a second output 152B. System 100 includes currents 154 and 156.

System 100 also includes a voltage input 158 that provides a voltage $V_{REFAMP\_IR}$. $V_{REFAMP\_IR}$ is the reference voltage provided to input 114 of amplifier 106 during the internal-resistor mode. System 100 also includes a voltage input 160 that provides a voltage $V_{REFAMP\_XR}$. $V_{REFAMP\_XR}$ is the reference voltage provided to input 114 of amplifier 106 during the external-resistor mode. A feedback voltage $V_{FB}$ is provided to input 162 of amplifier 106. Input 162 is also coupled to switches 110 and 112, which connect and disconnect the external resistor $R_{EXT}$ 122 and the internal resistor $R_{INT}$ 128, respectively. Switch 164 couples input 114 to voltage input 158 for the internal-resistor mode, while switch 166 couples input 114 to voltage input 160 for the external-resistor mode.

In the operation of system 100, charging current generator 102 provides a charging current to circuitry in system 100 that produces an oscillating waveform. As described above, an external resistor (such as external resistor $R_{EXT}$ 122) is located outside of the chip and is useful for providing an accurate oscillator. The external resistor $R_{EXT}$ 122 is coupled to node 120, which is a pin of the chip. The external capacitor $C_{EXT}$ 124 is coupled in parallel to external resistor $R_{EXT}$ 122, and is configured to provide filtering for noise that occurs at node 120.

In operation, charging current generator 102 provides a charging current 156 to oscillator circuitry 103 that produces an oscillating waveform. Amplifier 106 has a first input coupled to the appropriate $V_{REFAMP}$ voltage for the selected mode, and a second input coupled to a source of transistor 108. A gate of transistor 108 is coupled to the output of amplifier 106. Amplifier 106 ensures a reference voltage $V_{REFAMP}$ is divided by the selected resistor (either external resistor $R_{EXT}$ 122 or internal resistor $R_{INT}$ 128), which produces a reference current 154 ($I_{REF}$) through transistor 108. A drain of transistor 108 is coupled to current mirror 104. Current mirror 104 mirrors reference current 154 to produce charging current 156 ($I_{CHG}$), which is a charging current for the oscillator circuitry 103. The current mirror 104 may have a ratio of 1:m, so charging current 156 is m times as large as reference current 154. Any number of transistors 118 may be included in current mirror 104 to produce a specific value of m.

Switches 130 are labeled either Φ1 or Φ2 indicating their switching behavior. In this example, switches 130A and 130D are Φ1, while switches 130B and 130C are Φ2. The Φ1 switches 130A and 130D alternate opening and closing with the Φ2 switches 130B and 130C. The switches 130 are configured to charge and discharge the capacitors 134 to produce an oscillating waveform. The opening and closing of the switches 130 produces voltages at nodes 136A and 136B.

For example, if switches 130B and 130C are closed while switches 130A and 130D are open, node 136A is shorted to ground 126 via switch 130C. Charging current 156 flows through switch 130B and charges capacitor 134B. Therefore, a first voltage at node 136B begins to ramp up. The first voltage at node 136B ramps up until it reaches the predetermined value of voltage $V_{REFCOMP}$ at input node 140 of block 138. Block 138 provides the inputs ($V_{REFCOMP}$, node 136A, node 136B) to comparator 144 on first input 146A and second input 146B. Block 138 selects which inputs ($V_{REFCOMP}$, node 136A, node 136B) to provide to comparator 144. In this example, block 138 provides the predetermined value of voltage $V_{REFCOMP}$ to first input 146A and the first voltage at node 136B to second input 146B. When the first voltage at node 136B reaches $V_{REFCOMP}$, comparator 144 toggles its outputs 148A and 148B, and the phases Φ1 and Φ2 reverse their polarity via phase generator 150. Toggling these outputs 148A and 148B activates the switches 130. For example, switches 130B and 130C open, and switches 130A and 130D close responsive to the toggling. After the toggling, the first voltage at node 136B is shorted to ground 126 via closed switch 130D. Node 136A is coupled to current mirror 104 via closed switch 130A, and charging current 156 begins charging capacitor 134A. A second voltage at node 136A begins to ramp up via the charging of capacitor 134A, and the process repeats. The second voltage ramps up until it reaches $V_{REFCOMP}$, at which time comparator 144 toggles its outputs 148A and 148B again. This repeating process provides an oscillating clock signal.

For an oscillator operating in internal-resistor mode, the frequency of the oscillator is given by Equation (1):

$$f=(V_{REFAMP\_IR}/V_{REFCOMP})\times m/(2R_{INT}C) \quad (1)$$

where m is the current mirror ratio, $R_{INT}$ is the value of internal resistor $R_{INT}$ 128, and C is the value of capacitor 134A or 134B. The value of m may be 1, less than 1, or greater than 1 in various examples. As shown in FIG. 1, in the internal-resistor mode, switches 112 and 164 are closed, while switches 110 and 166 are open.

For an oscillator operating in external-resistor mode, the frequency of the oscillator is given by Equation (2):

$$f=(V_{REFAMP\_XR}/V_{REFCOMP})\times m/(2R_{EXT}C) \quad (2)$$

where m is the current mirror ratio, $R_{EXT}$ is the value of external resistor $R_{EXT}$ 122, and C is the value of capacitor 134A or 134B. As shown in FIG. 1, in the external-resistor mode, switches 110 and 166 are closed, while switches 112 and 164 are open.

Additional circuitry described below with respect to FIGS. 2-5B includes the voltages, switches, and other components that implement the three-phase solution described above. This additional circuitry is omitted from FIG. 1 for simplicity. Any suitable controller may be useful for opening and closing the switches in the examples described herein.

Figure 2:
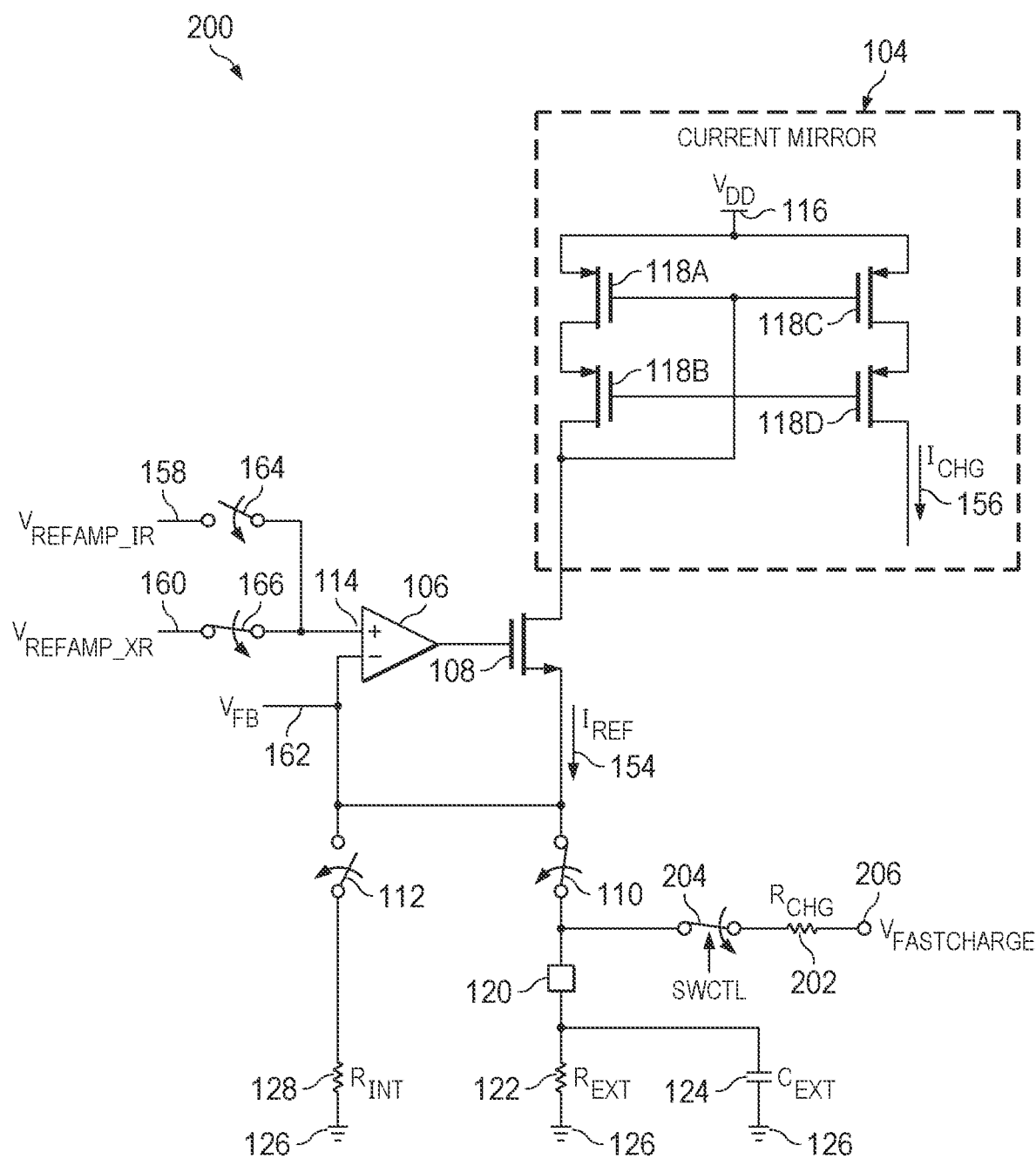
FIG. 2 is a circuit diagram of a system for fast charging of a capacitor in accordance with various examples.

FIG. 2 is a circuit diagram of a system 200 for fast charging of a capacitor in accordance with various examples herein. In FIG. 2, the same reference numbers or other reference designators are used as in FIG. 1 to designate the same or similar (functionally and/or structurally) features. The structure and operation of many of the components of system 200 are described above with respect to FIG. 1, so a detailed explanation of the components of system 200 is omitted for simplicity. Some components from FIG. 1 are omitted in FIG. 2, such as oscillator circuitry 103, but may be included and coupled as described above. System 200 includes charging resistor Ram 202, switch 204, and node 206, which is coupled to a voltage source that provides a voltage $V_{FASTCHARGE}$. A signal SWCTL from a controller controls the operation of switch 204. Charging resistor $R_{CHG}$ 202 is coupled to switch 204 and node 206. Switch 204 is coupled to node 120.

In system 200, switches 110, 166, and 204 are closed, while switches 112 and 164 are open. This example is a low area solution that uses RC (resistor/capacitor) charging to charge the external capacitor $C_{EXT}$ 124. The value of the voltage $V_{FASTCHARGE}$ is close to the value of $V_{REFAMP\_XR}$ in some examples. In this example, external capacitor $C_{EXT}$ 124 is charged in one phase. In internal-resistor mode, switches 112 and 164 are closed. To switch to external-resistor mode, switches 110, 166, and 204 are closed, while switches 112 and 164 are opened. After switches 110, 166, and 204 are closed, voltage input 158 is connected to amplifier 106, external resistor $R_{EXT}$ 122 is connected to node 120, and charging resistor Ram 202 is connected to node 120. System 200 is then operating in external-resistor mode. The purpose of $V_{FASTCHARGE}$ is to quickly charge external capacitor $C_{EXT}$ 124 so operation of the oscillator in external-resistor mode may begin. In this example, there is no overcharging of external capacitor $C_{EXT}$ 124, as it will only charge to the appropriate value based on the values of $V_{FASTCHARGE}$ and charging resistor Ram 202. These components, however, are not automatically disconnected after external capacitor $C_{EXT}$ 124 is charged. Also, some uncontrolled variation in charging current 156 ($I_{CHG}$) may still occur in this example. Therefore, the description below with respect to FIGS. 3A-5B describes the three-phase solution that reduces frequency variation of the oscillator during the transition from internal-resistor mode to external-resistor mode.

Figure 3A:
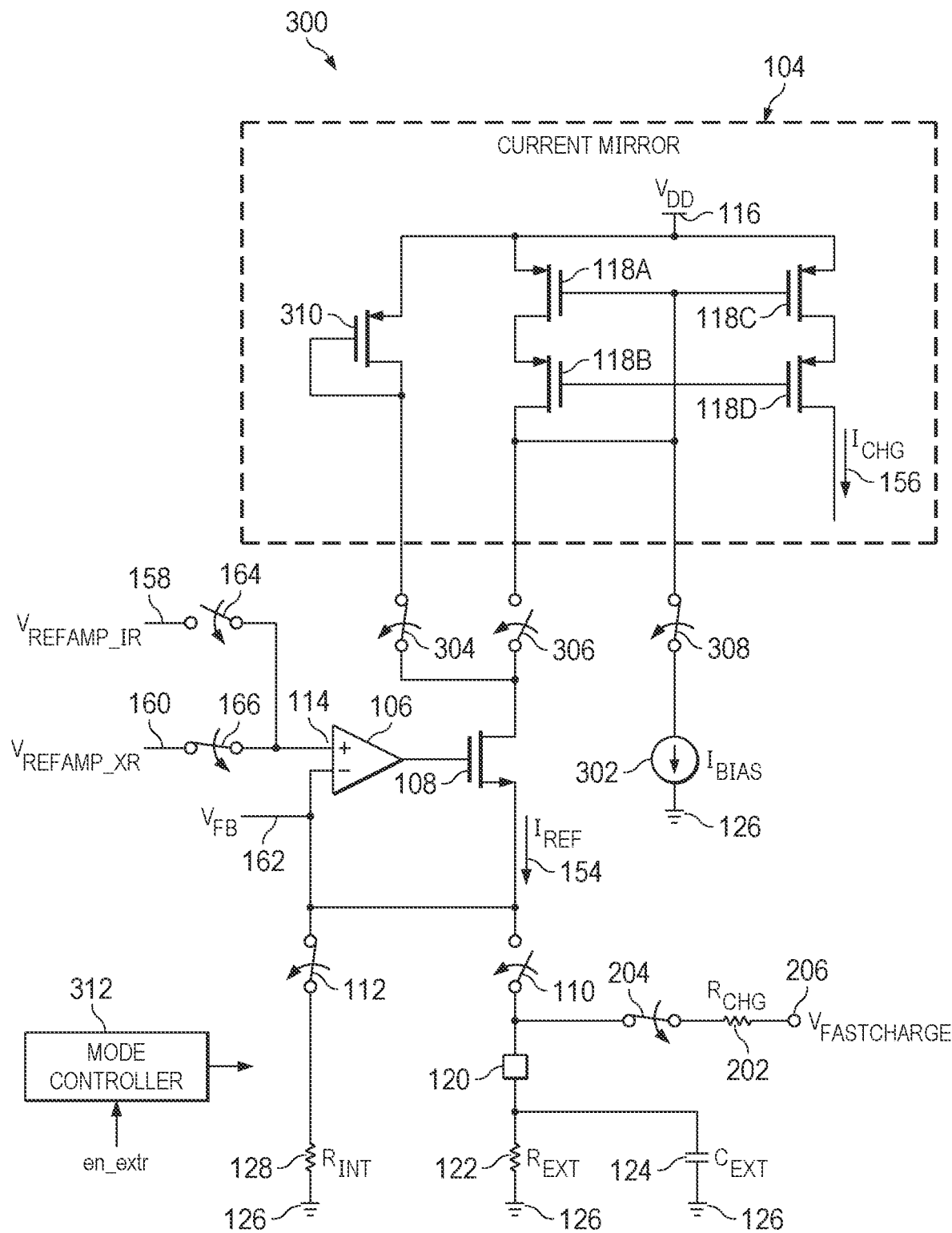
FIG. 3A is a circuit diagram of a system for switching from internal-resistor mode to external-resistor mode in accordance with various examples.
Figure 3B:
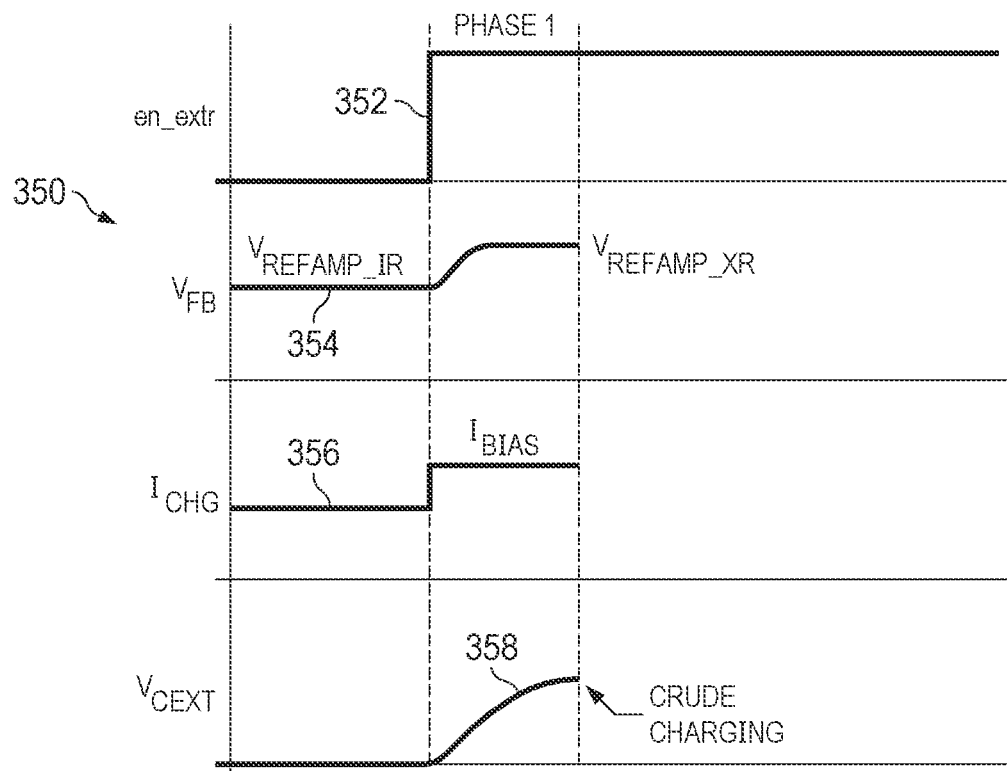
FIG. 3B is a collection of waveforms for a first phase of switching from internal-resistor mode to external-resistor mode in accordance with various examples.

FIG. 3A is a circuit diagram of a system 300 for switching from internal-resistor mode to external-resistor mode in accordance with various examples herein. FIG. 3B is a collection of waveforms 350 for a first phase of switching from internal-resistor mode to external-resistor mode in accordance with various examples herein. The first phase of an example solution is described herein with respect to FIGS. 3A and 3B. As described above, the three-phase solution includes fast charging with the internal resistor connected and the external resistor disconnected (phase 1, FIGS. 3A and 3B), disconnecting the internal resistor and connecting the external resistor (phase 2, FIGS. 4A and 4B), and disconnecting a bias current source and connecting the current mirror (phase 3, FIGS. 5A and 5B). The three phases are described in turn below.

Referring again to FIG. 3A, the same reference numbers or other reference designators are used as in FIGS. 1 and 2 to designate the same or similar (functionally and/or structurally) features. The structure and operation of many of the components of system 300 are described above with respect to FIGS. 1 and 2, so a detailed explanation of the components of system 300 is omitted for simplicity. Some components from FIG. 1 are omitted in FIG. 3A, such as oscillator circuitry 103, but may be included and coupled as described above. System 300 includes bias current source 302, switches 304, 306, and 308, and transistor 310. System 300 also includes mode controller 312. Bias current source 302 produces a current $I_{BIAS}$ for current mirror 104. Switches 304, 306, and 308 connect various circuit components. Transistor 310 biases current mirror 104 during this phase. Mode controller 312 controls the switches in FIG. 3A to perform the switch from internal-resistor mode to external-resistor mode in the manner described herein.

In operation, FIG. 3A shows the first phase of the transition from internal-resistor mode to external-resistor mode. In the internal-resistor mode, mode controller 312 causes switches 110, 164, 204, 304, and 308 to be open, while switches 112, 166, and 306 are closed. In the first phase of the transition to external-resistor mode, mode controller 312 in system 300 has received the instruction to transition to external-resistor mode (e.g., an en_extr signal). In this first phase of the transition, switch 110 remains open and switch 112 remains closed, as they were during the internal-resistor mode. However, in the first phase, the mode controller 312 causes switch 166 to close and switch 164 to open. Switch 166 couples input 114 of amplifier 106 to voltage input 160, which provides the $V_{REFAMP\_XR}$ voltage to input 114. Voltage input 158, which provides the $V_{REFAMP\_XR}$ voltage, is disconnected from input 114 via the opening of switch 164.

Also, in the first phase, mode controller 312 causes switch 204 to close. The closing of switch 204 couples external capacitor $C_{EXT}$ 124 to charging resistor Ram 202, and the $V_{FASTCHARGE}$ voltage begins charging external capacitor $C_{EXT}$ 124.

Finally, in the first phase, mode controller 312 causes switches 304 and 308 to close, and switch 306 to open. The closing of switch 308 couples bias current source 302 to current mirror 104. Bias current source 302 provides a steady current $I_{BIAS}$ with a controlled magnitude to current mirror 104, and current mirror 104 provides a charging current 156 to oscillator circuitry 103 (not shown in FIG. 3A). The reference current 154 may fluctuate during the transition from internal-resistor mode to external-resistor mode and cause fluctuations in the oscillator frequency. Therefore, switches 304, 306, and 308 operate to provide the steady current $I_{BIAS}$ to current mirror 104 rather than reference current 154. With the steady current $I_{BIAS}$ provided to current mirror 104, the oscillator may continue to run with a controlled magnitude current and remain unaware of the transition to external-resistor mode occurring in other portions of the circuit.

Therefore, in the first phase, the bias current source 302 keeps the oscillator running with a steady current, the reference voltage at input 114 of amplifier 106 changes from $V_{REFAMP\_IR}$ to $V_{REFAMP\_XR}$, and the external capacitor $C_{EXT}$ 124 is charged using the RC charging scheme.

In one example, switch 110 is a first switch, switch 204 is a second switch, and switch 112 is a third switch. In an example, switch 306 is a fourth switch, switch 166 is a fifth switch, and switch 164 is a sixth switch.

FIG. 3B is a collection of waveforms 350 for a first phase of switching from internal-resistor mode to external-resistor mode in accordance with various examples herein. Waveform 352 is the signal en_extr that enables the transition from internal-resistor mode to external-resistor mode. When the en_extr signal goes from low to high, phase 1 begins. The switches 110, 112 204, 164, 166, 304, 306, and 308 all switch states as phase 1 begins.

Waveform 354 is the $V_{FB}$ voltage at the second input 162 of amplifier 106. Before phase 1 begins, $V_{FB}$ at second input 162 is at the voltage $V_{REFAMP\_IR}$. After phase 1 begins, the voltage $V_{FB}$ transitions from $V_{REFAMP\_IR}$ to $V_{REFAMP\_XR}$, because the voltage at first input 114 changes due to the transition of switches 164 and 166.

Waveform 356 is the charging current 156 ($I_{CHG}$). Charging current 156 is dependent on reference current 154 before phase 1. After phase 1 begins, bias current source 302 provides a steady current for current mirror 104. If the current mirror ratio is 1:1, charging current 156 ($I_{CHG}$) equals $I_{BIAS}$ after phase 1 begins.

Waveform 358 shows the voltage across external capacitor $C_{EXT}$ 124. The voltage across external capacitor $C_{EXT}$ 124 begins to rise after phase 1 begins. The charging of external capacitor $C_{EXT}$ 124 is performed via RC charging, which performs a crude charging during phase 1.

Figure 4B:
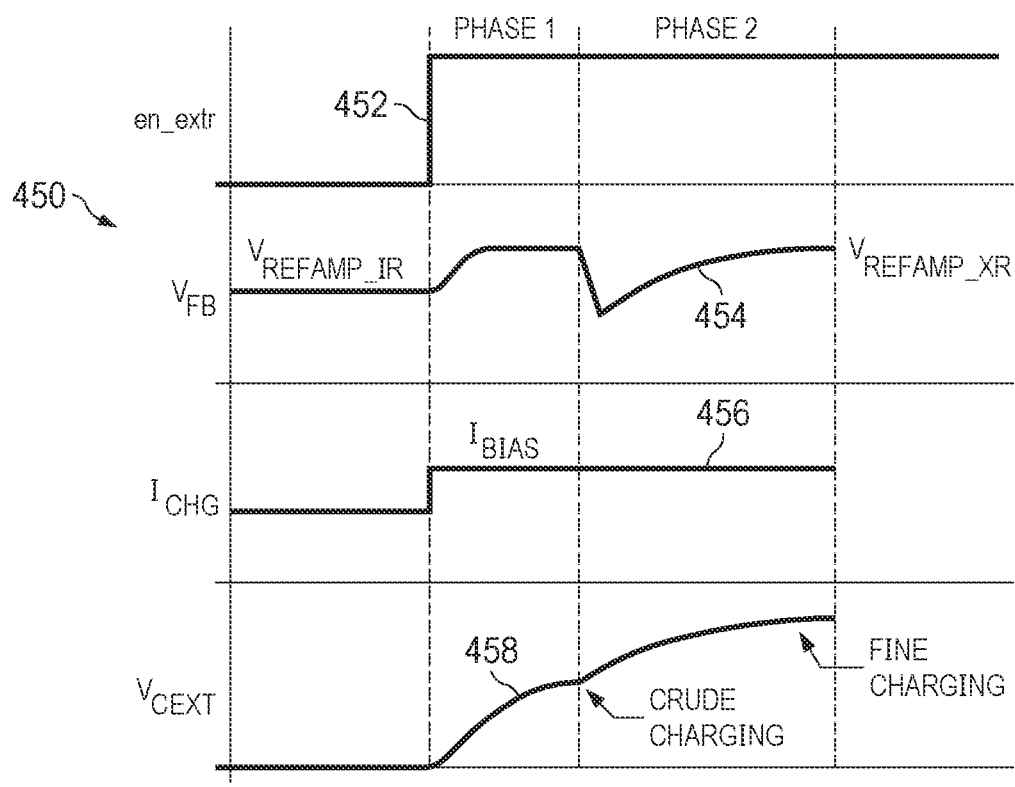
FIG. 4B is a collection of waveforms for a second phase of switching from internal-resistor mode to external-resistor mode in accordance with various examples.
Figure 4A:
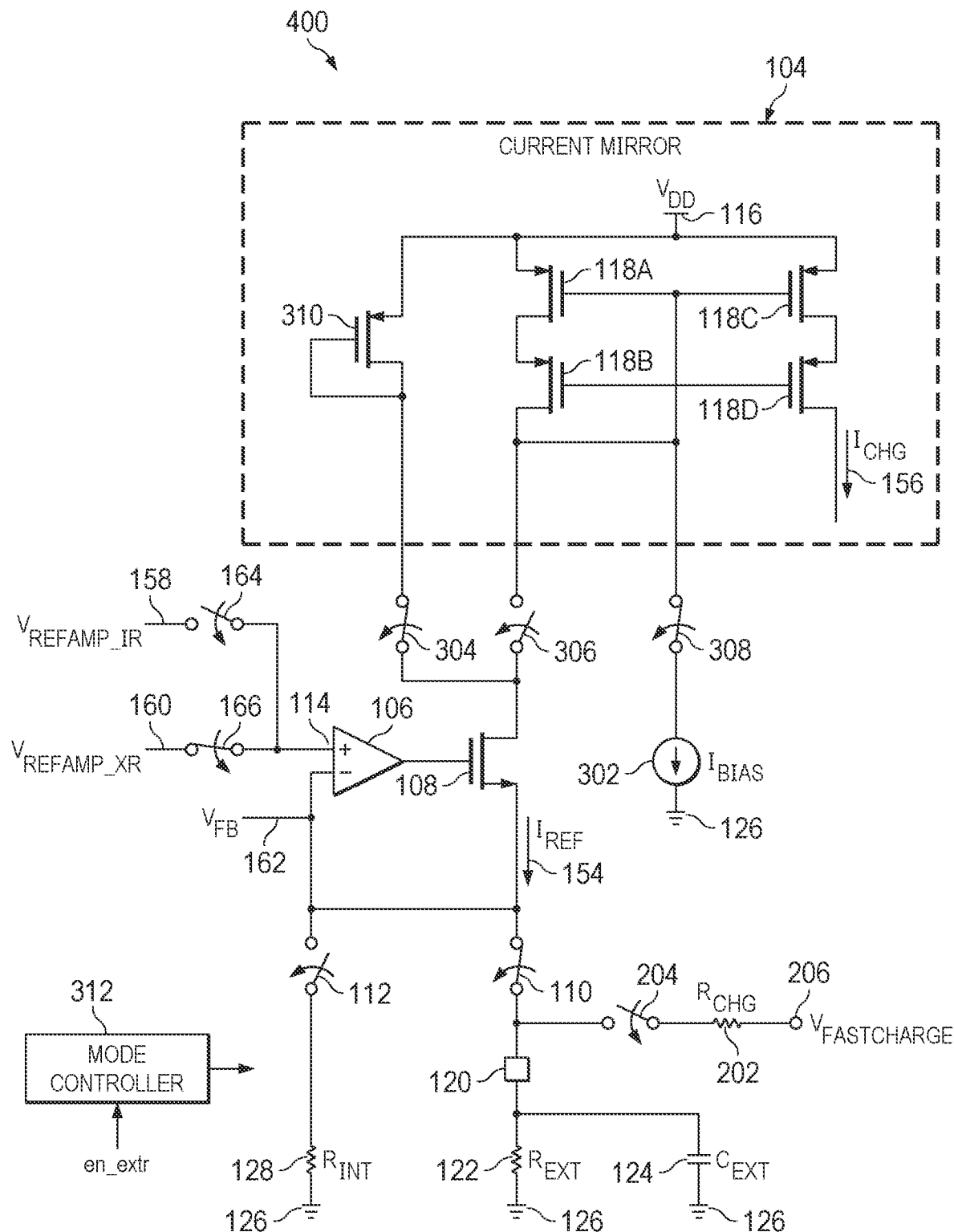
FIG. 4A is a circuit diagram of a system for switching from internal-resistor mode to external-resistor mode in accordance with various examples.

FIG. 4A is a circuit diagram of a system 400 for switching from internal-resistor mode to external-resistor mode in accordance with various examples herein. FIG. 4B is a collection of waveforms 450 for a second phase of switching from internal-resistor mode to external-resistor mode in accordance with various examples herein. The second phase of an example solution is described herein with respect to FIGS. 4A and 4B.

In FIG. 4A, the same reference numbers or other reference designators are used as in FIGS. 1, 2, and 3 to designate the same or similar (functionally and/or structurally) features. The structure and operation of many of the components of system 400 are described above with respect to FIGS. 1, 2, and 3, so a detailed explanation of the components of system 400 is omitted for simplicity. Some components from FIG. 1 are omitted in FIG. 4A, such as oscillator circuitry 103, but may be included and coupled as described above.

In operation, FIG. 4A shows the second phase of the transition from internal-resistor mode to external-resistor mode. In the second phase, crude charging of external capacitor $C_{EXT}$ 124 is complete. Also, in the second phase, the RC charging path is disconnected via switch 204, and switches 110 and 112 change state. Mode controller 312 causes switch 112 to open, which disconnects internal resistor $R_{INT}$ 128, and causes switch 110 to close to connect external resistor $R_{EXT}$ 122. The second phase is a fine charging phase for external capacitor $C_{EXT}$ 124. If the voltages at the first input 114 and second input 162 of amplifier 106 are different, amplifier 106 reacts and stabilizes the voltages. The voltage $V_{FB}$ at second input 162 will climb to the value of $V_{REFAMP\_XR}$, and phase 2 ends when $V_{FB}$ reaches $V_{REFAMP\_XR}$. The bias current source 302 continues to keep the oscillator running with a steady current in phase 2.

FIG. 4B is a collection of waveforms 450 for a second phase of switching from internal-resistor mode to external-resistor mode in accordance with various examples herein. Waveform 452 is the signal en_extr that enables the transition from internal-resistor mode to external-resistor mode. The signal en_extr remains high during the second phase.

Waveform 454 is the $V_{FB}$ voltage at the second input 162 of amplifier 106. The $V_{FB}$ voltage drops after phase 1 transitions to phase 2 due to the internal resistor $R_{INT}$ 128 being disconnected via switch 112 and the external resistor $R_{EXT}$ 122 being connected via switch 110. The $V_{FB}$ voltage after the beginning of phase 2 drops to a voltage at or near the level of the voltage across external capacitor $C_{EXT}$ 124, which undergoes its crude charging phase during phase 1. The crude charging phase for external capacitor $C_{EXT}$ 124 is performed with RC charging using charging resistor $R_{CHG}$ 202. During phase 2, amplifier 106 raises the voltage $V_{FB}$ to the level of $V_{REFAMP\_XR}$, as shown in waveform 454. By raising the voltage $V_{FB}$ to $V_{REFAMP\_XR}$, amplifier 106 also charges external capacitor $C_{EXT}$ 124.

Waveform 456 shows that the charging current 156 remains at the level of the $I_{BIAS}$ current produced by bias current source 302. Charging current 156 remains at this level while bias current source 302 is connected to current mirror 104.

Waveform 458 shows the voltage across external capacitor $C_{EXT}$ 124. The voltage across external capacitor $C_{EXT}$ 124 continues to rise during phase 2. The charging of external capacitor $C_{EXT}$ 124 is performed via amplifier 106 and the $V_{REFAMP\_XR}$ voltage, which performs a fine charging during phase 2.

Figure 5A:
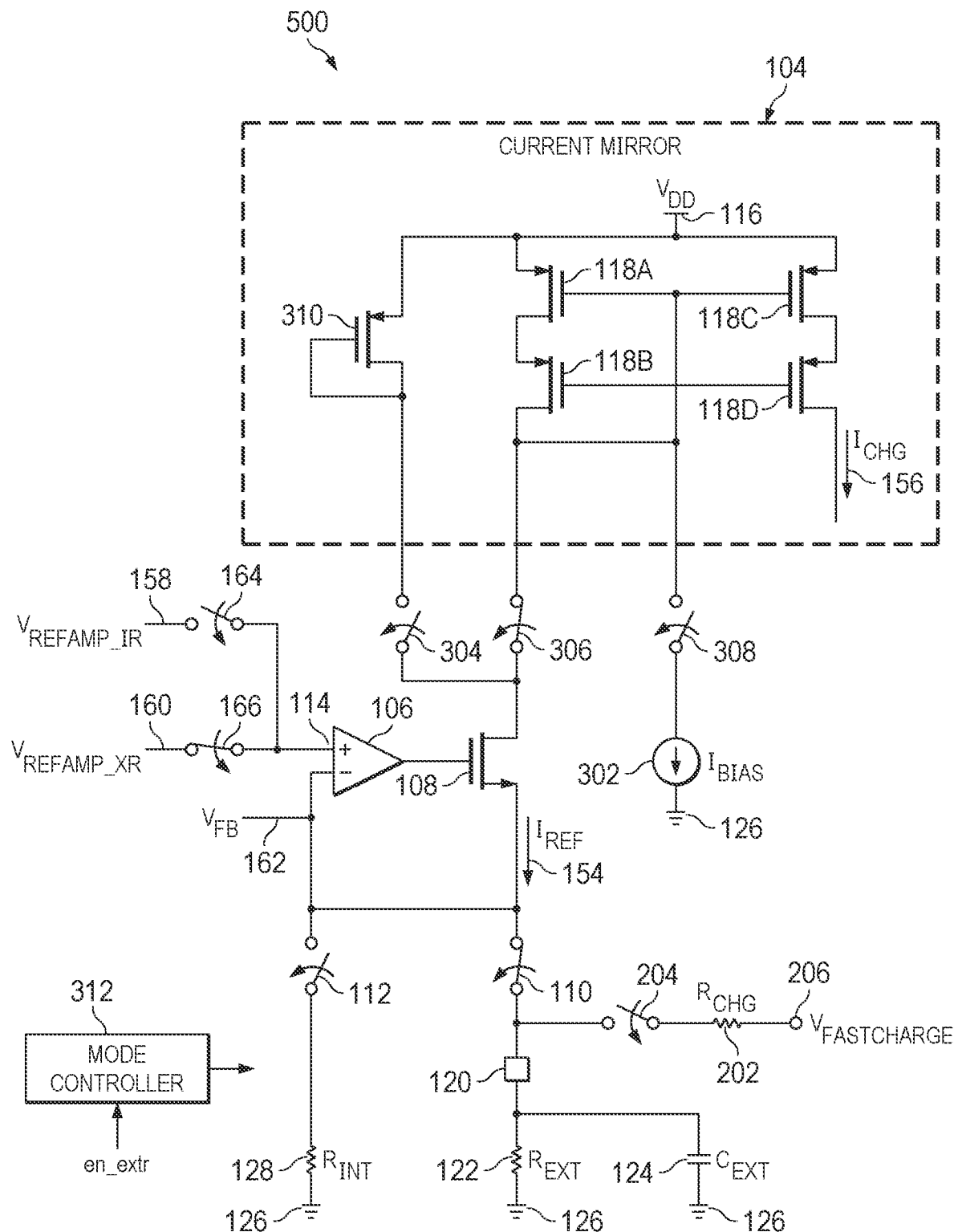
FIG. 5A is a circuit diagram of a system for switching from internal-resistor mode to external-resistor mode in accordance with various examples.
Figure 5B:
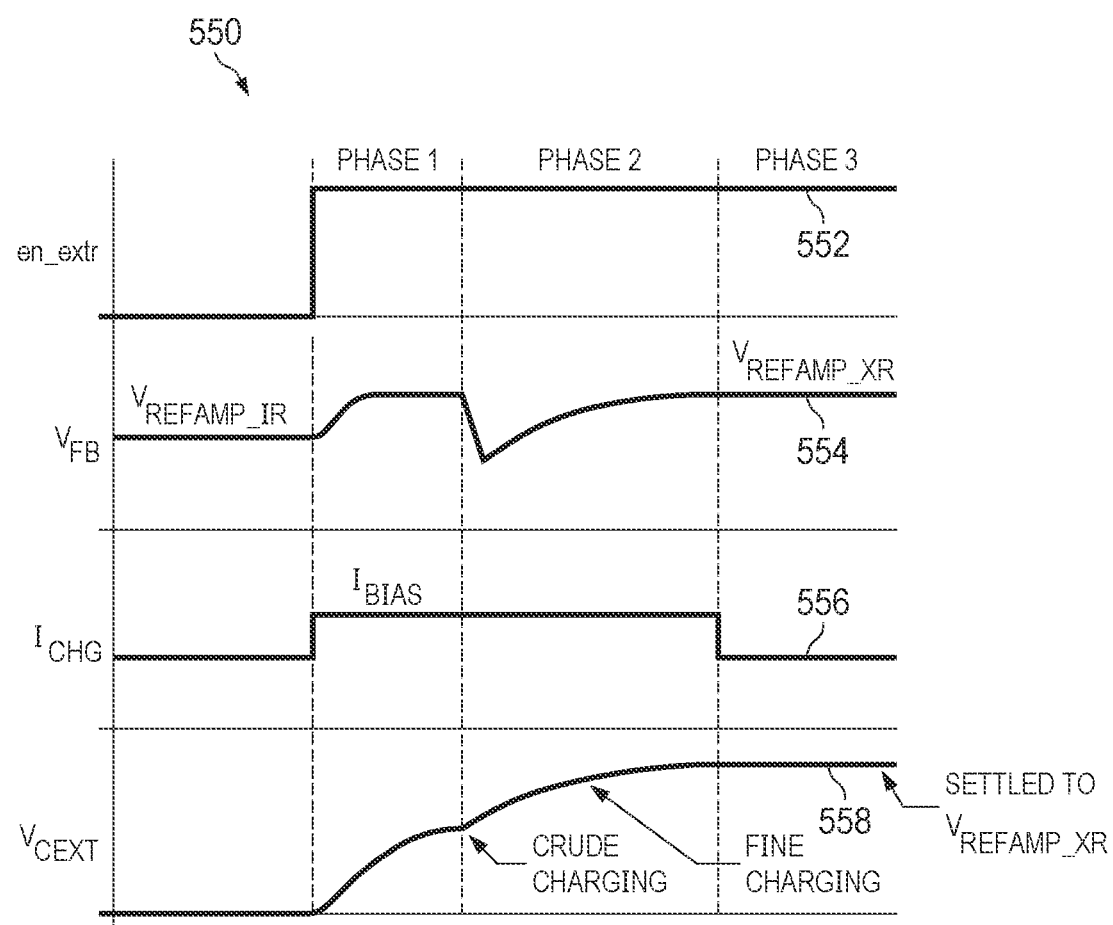
FIG. 5B is a collection of waveforms for a third phase of switching from internal-resistor mode to external-resistor mode in accordance with various examples.

FIG. 5A is a circuit diagram of a system 500 for switching from internal-resistor mode to external-resistor mode in accordance with various examples herein. FIG. 5B is a collection of waveforms 450 for a third phase of switching from internal-resistor mode to external-resistor mode in accordance with various examples herein. The third phase of an example solution is described herein with respect to FIGS. 5A and 5B.

In FIG. 5A, the same reference numbers or other reference designators are used as in FIGS. 1, 2, and 3 to designate the same or similar (functionally and/or structurally) features. The structure and operation of many of the components of system 500 are described above with respect to FIGS. 1, 2, and 3 so a detailed explanation of the components of system 500 is omitted for simplicity. Some components from FIG. 1 are omitted in FIG. 5A, such as oscillator circuitry 103, but may be included and coupled as described above.

In operation, FIG. 5A shows the third phase of the transition from internal-resistor mode to external-resistor mode. In the third phase, the current mirror 104 is reverted back to receiving reference current 154. After fine charging of external capacitor $C_{EXT}$ 124 is complete, current 154 is stable and current mirror 104 may begin operating again using current 154. Therefore, at the beginning of phase 3, mode controller 312 causes switches 304, 306, and 308 to change state. Switch 304 opens, which disconnects transistor 310. Switch 308 opens, which disconnects bias current source 302 from current mirror 104. Switch 306 closes, which connects current mirror 104 to transistor 108. After these transitions, current mirror 104 again operates by receiving reference current 154, which is provided by amplifier 106, external resistor $R_{EXT}$ 122, and the associated circuitry. At the end of phase 3, system 500 is operating in external-resistor mode.

FIG. 5B is a collection of waveforms 550 for a second phase of switching from internal-resistor mode to external-resistor mode in accordance with various examples herein. Waveform 552 is the signal en_extr that enables the transition from internal-resistor mode to external-resistor mode. The signal en_extr remains high during the third phase.

Waveform 554 is the $V_{FB}$ voltage at the second input 162 of amplifier 106. The $V_{FB}$ voltage is held at or near $V_{REFAMP\_XR}$ during phase 3, due to amplifier 106 stabilizing the $V_{FB}$ voltage.

Waveform 556 shows that the charging current 156 ($I_{CHG}$) is no longer at the level of current $I_{BIAS}$ after phase 3 begins. In phase 3, bias current source 302 is disconnected, and the current mirror 104 again reverts to operating with current 154 ($I_{REF}$). Therefore, charging current 156 reverts to the level of current 154 (if the current ratio is 1:1).

Waveform 558 shows the voltage across external capacitor $C_{EXT}$ 124. The voltage across external capacitor $C_{EXT}$ 124 settles at $V_{REFAMP\_XR}$ during phase 3. The voltage across external capacitor $C_{EXT}$ 124 is held at this level during external-resistor mode due to the operation of amplifier 106.

Waveform 556 shows that the charging current 156 does not undergo uncontrolled variations during the transition from internal-resistor mode to external-resistor mode. Instead, bias current source 302 keeps the charging current 156 at a stable level, which stabilizes the frequency of the oscillator during the transition.

Waveform 554 shows that the voltage $V_{FB}$ does not undergo large swings during the transition from internal-resistor mode to external-resistor mode. Therefore, there is not a large differential input voltage across the inputs of amplifier 106. A large differential input voltage may result in asymmetric aging of the amplifier 106, which changes the accuracy of the frequency of the oscillator over time. Examples herein reduce this asymmetric aging of amplifier 106.

External signals may be generated to switch between phases in accordance with the examples herein. Any available methods are useful in examples herein to generate the various switch control signals. Analog delays may be generated using RC circuits and digital buffers. Digital delays may be generated based on any available clock on the chip. Some solutions may use more chip area or require more complexity than other solutions. To accommodate different values of the external capacitor $C_{EXT}$ 124, the width of the phases may be digitally programmable to cause different delays.

Figure 6:
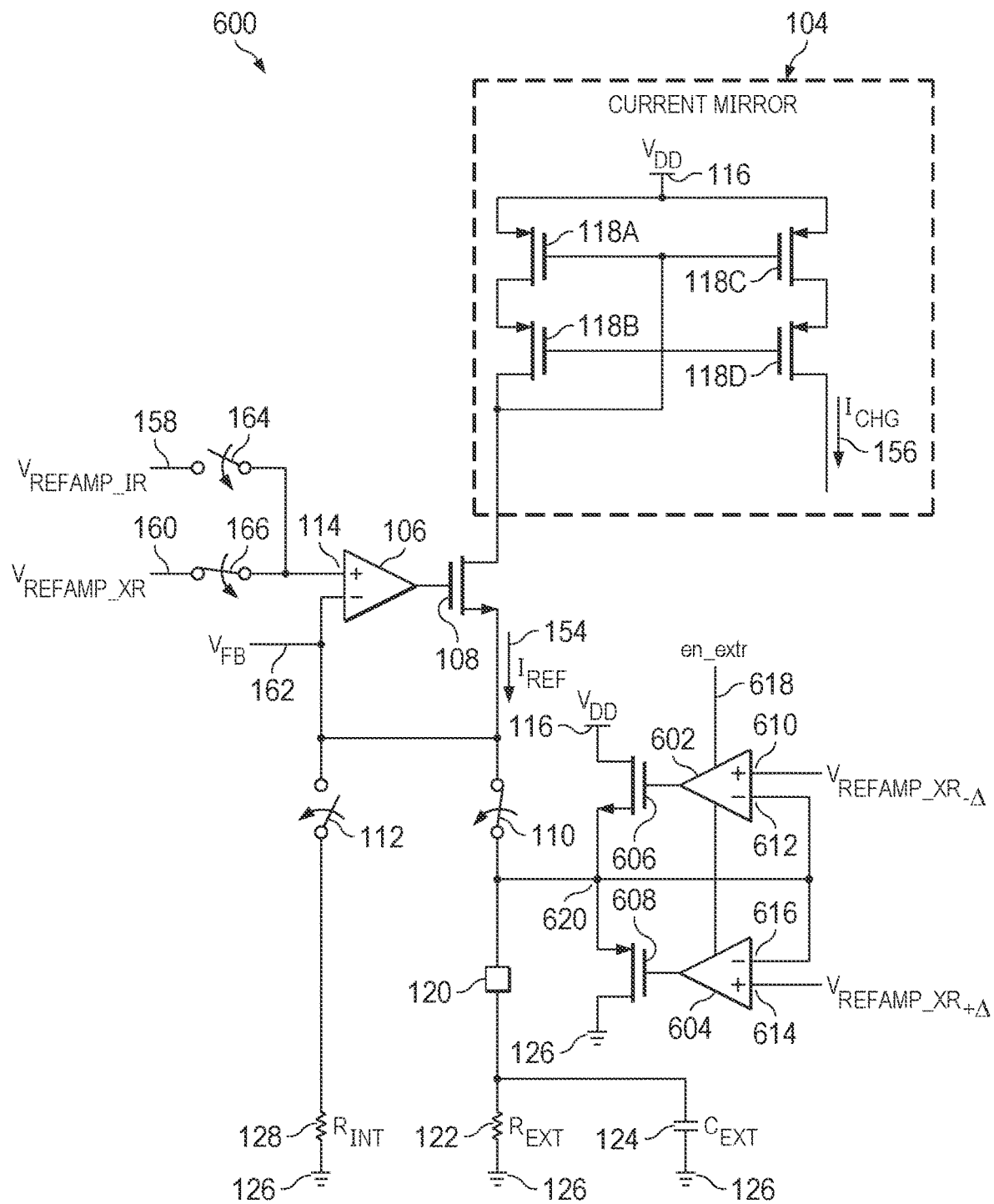
FIG. 6 is a circuit diagram of a system for switching from internal-resistor mode to external-resistor mode in accordance with various examples.

FIG. 6 is a circuit diagram of a system 600 for switching from internal-resistor mode to external-resistor mode in accordance with various examples herein. In FIG. 6, the same reference numbers or other reference designators are used as in FIG. 1 to designate the same or similar (functionally and/or structurally) features. The structure and operation of many of the components of system 600 are described above with respect to FIG. 1, so a detailed explanation of the components of system 600 is omitted for simplicity. Some components from FIG. 1 are omitted in FIG. 6, such as oscillator circuitry 103, but may be included and coupled as described above.

System 600 includes an amplifier 602, amplifier 604, transistor 606, and transistor 608. Amplifier 602 includes a first input 610 and second input 612. Amplifier 604 includes a first input 614 and a second input 616. An en_extr signal 618 is provided to amplifiers 602 and 604. Node 620 is coupled between transistor 606 and transistor 608.

System 600 uses amplifiers 602 and 604 in conjunction with transistors 606 and 608 to provide a pull-up or pull-down current to node 120. First input 610 of amplifier 602 is coupled to a voltage $V_{REFAMP\_XR}-\Delta$. Second input 612 of amplifier 602 is coupled to node 620. First input 614 of amplifier 604 is coupled to a voltage $V_{REFAMP\_XR}+\Delta$. Second input 616 of amplifier 604 is coupled to node 620. The voltage at node 120 is sensed by the amplifiers 602, 604 at their respective second inputs 612, 616. If the voltage at node 120 is larger than $V_{REFAMP\_XR}$, amplifier 602 and transistor 606 turn off, and transistor 608 discharges the voltage at node 120. If the voltage at node 120 is smaller than $V_{REFAMP\_XR}$, amplifier 604 and transistor 608 turn off, and transistor 606 pulls up the voltage at node 120. Therefore, the amplifiers 602, 604 and transistors 606, 608 bring the voltage at node 120 to $V_{REFAMP\_XR}$, which is the proper voltage across external capacitor $C_{EXT}$ 124.

After the voltage at node 120 reaches $V_{REFAMP\_XR}$, the amplifiers 602, 604 and transistors 606, 608 may be disconnected from node 120. If these components are not disconnected, leakage current may occur. Any suitable circuitry may be used in other examples to disconnect these components from node 120. In system 600, a multi-phase transition may be performed as well, as described above with respect to FIGS. 3A-5B.

Figure 7A:
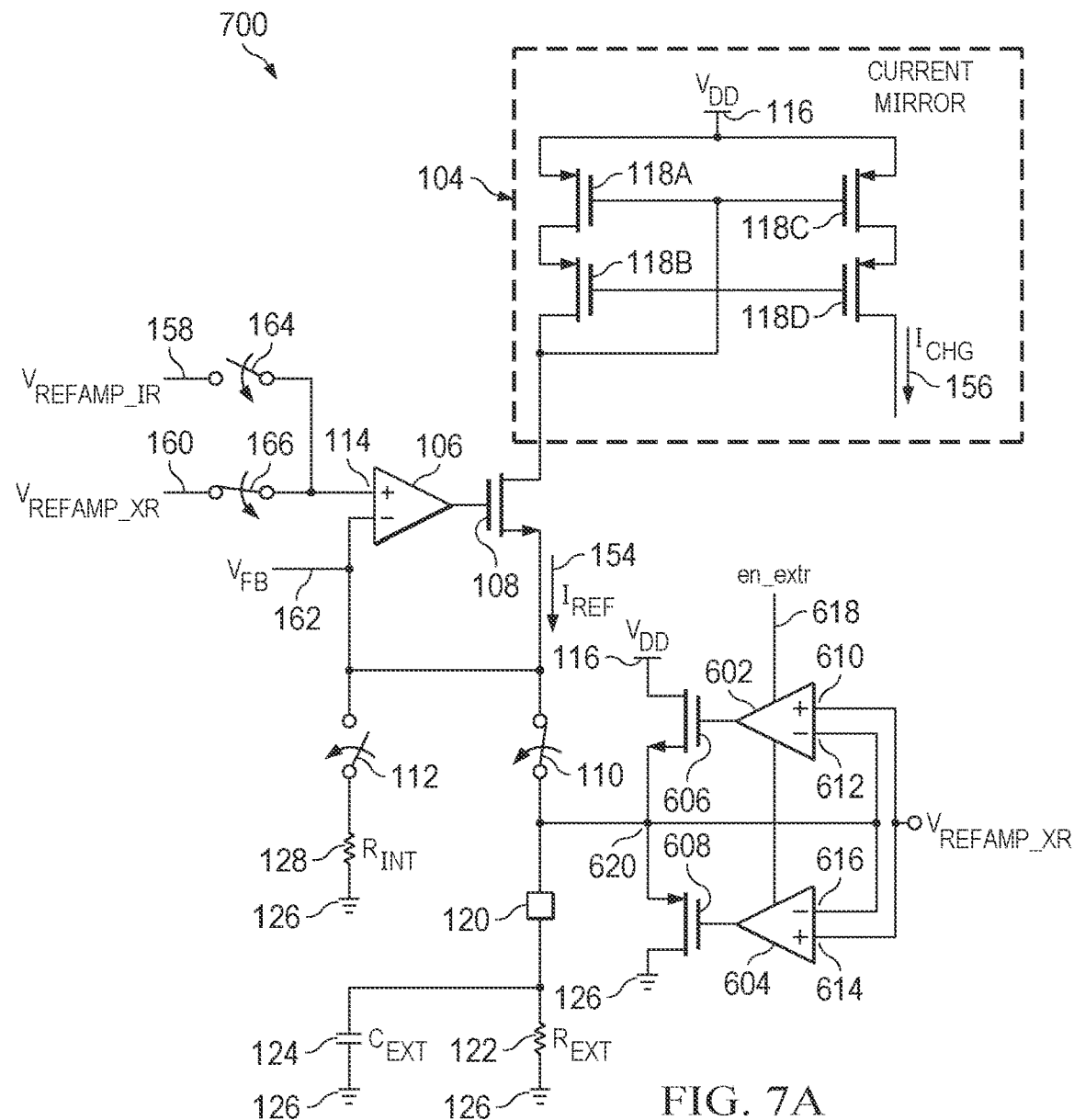
FIG. 7A is a circuit diagram of a system for switching from internal-resistor mode to external-resistor mode in accordance with various examples.
Figure 7B:
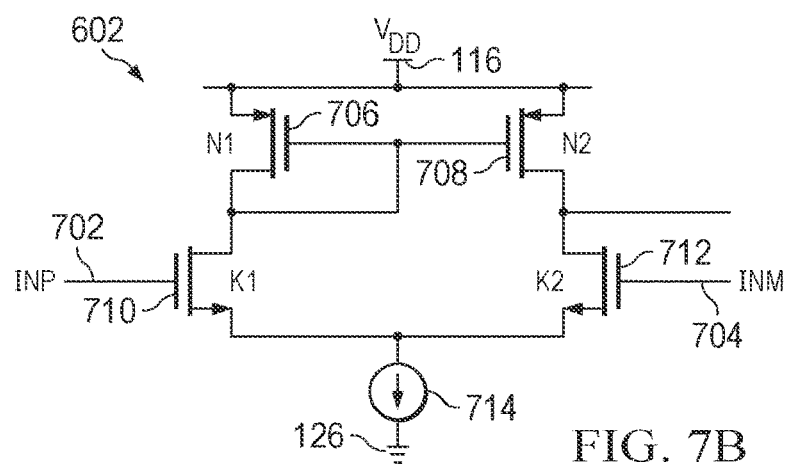
FIG. 7B is a circuit diagram of a system for switching from internal-resistor mode to external-resistor mode in accordance with various examples.

FIGS. 7A and 7B are circuit diagrams for a system 700 for switching from internal-resistor mode to external-resistor mode in accordance with various examples herein. In FIGS. 7A and 7B, the same reference numbers or other reference designators are used as in FIGS. 1 and 6 to designate the same or similar (functionally and/or structurally) features. The structure and operation of many of the components of system 700 are described above with respect to FIGS. 1 and 6, so a detailed explanation of the components of system 700 is omitted for simplicity. Some components from FIG. 1 are omitted in FIG. 7A, such as oscillator circuitry 103.

System 700 in FIG. 7A includes the push-pull amplifiers 602, 604 and transistor 606, 608 described above with respect to FIG. 6. In this example, a simplified structure of the internal circuitry of the amplifier 602 is shown in FIG. 7B. Amplifier 604 may have similar internal circuitry in some examples. Amplifier 602 includes input terminals 702 and 704, transistors N1 706 and N2 708, transistors K1 710 and K2 712, and current source 714. The circuitry within amplifier 602 (and 604) creates a systematic voltage offset at input terminals 702 and 704. The systematic voltage offset may be created by an asymmetry of sizing between transistors 706 and 708. In another example, an asymmetry between transistors 710 and 712 may also create a systematic voltage offset. In system 700, a multi-phase transition may be performed as well, as described above with respect to FIGS. 3A-5B.

Figure 8:
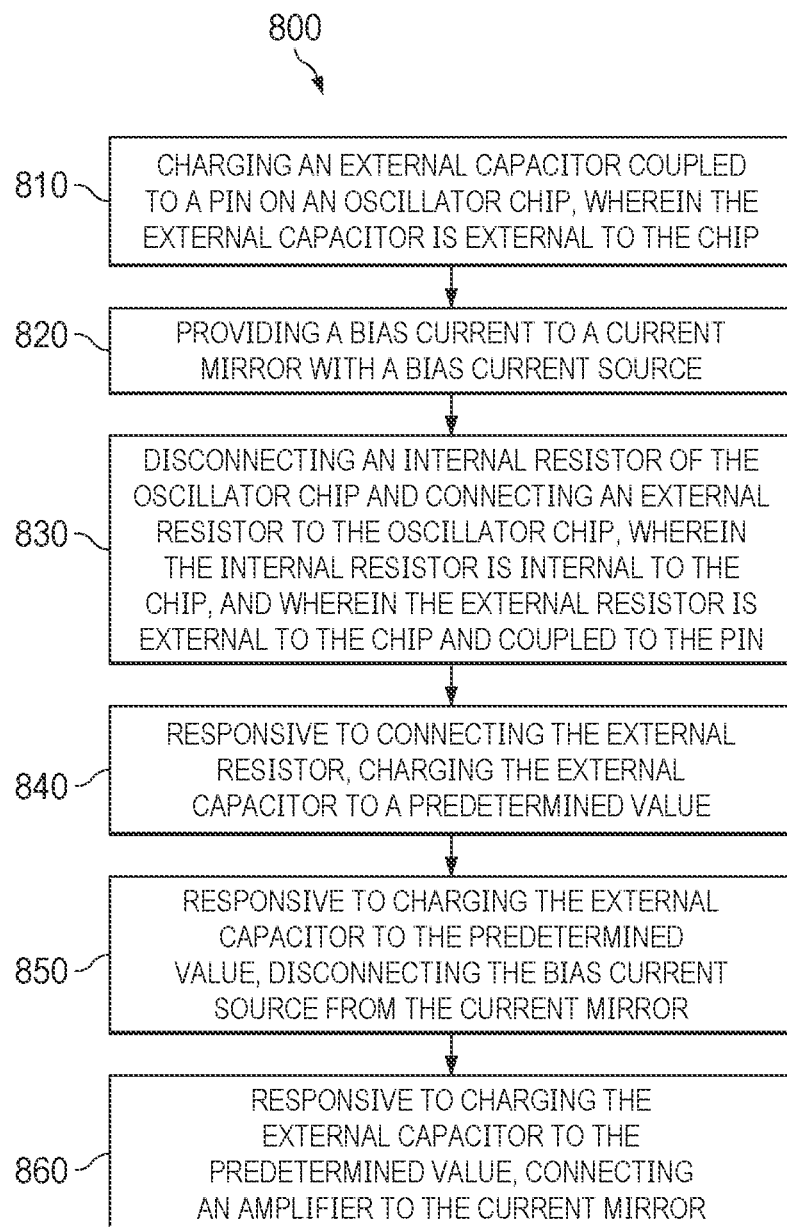
FIG. 8 is a flow diagram of a method for transition from internal-resistor mode to external-resistor mode in accordance with various examples.

FIG. 8 is a flow diagram of a method 800 for transition from internal-resistor mode to external-resistor mode in accordance with various example herein. The steps of method 800 may be performed in any suitable order. The hardware components described above with respect to FIGS. 1-7 may perform method 800 in some examples.

Method 800 begins at 810, where an external capacitor coupled to a pin on an oscillator chip is charged with a charging voltage. As an example, external capacitor $C_{EXT}$ 124 is charged when switch 204 closes and connects external capacitor $C_{EXT}$ 124 to a voltage such as $V_{FASTCHARGE}$.

Method 800 continues at 820, where a bias current source provides a bias current to a current mirror. As an example, bias current source 302 provides a current $I_{BIAS}$ to current mirror 104. The bias current $I_{BIAS}$ keeps current mirror 104 operating at a steady frequency while the oscillator chip is transitioning from internal-resistor mode to external-resistor mode. A switch such as switch 308 may couple bias current source 302 to current mirror 104.

Method 800 continues at 830, where a switch 112 disconnects an internal resistor of the oscillator chip and a switch 110 connects an external resistor to the oscillator chip, where the external resistor is coupled to the pin. Any suitable control circuitry may control the switches. As described above, these switches flip during a second phase of a three-phase transition from internal-resistor mode to external-resistor mode.

Method 800 continues at 840, where, responsive to connecting the external resistor, the external capacitor is charged to a predetermined value. In one example, the external capacitor $C_{EXT}$ 124 is charged to a predetermined value $V_{REFAMP\_XR}$ by amplifier 106. $V_{REFAMP\_XR}$ is the reference voltage value applied to input 114 of amplifier 106 during the external-resistor mode.

Method 800 continues at 850, where, responsive to charging the external capacitor to the predetermined value, the bias current source is disconnected from the current mirror. In an example, the bias current source 302 is disconnected by opening switch 308.

Method 800 continues at 860, where, responsive to charging the external capacitor to the predetermined value, the amplifier is connected to the current mirror. As described above, bias current source 302 is disconnected by opening switch 308. Also, switch 306 closes in phase 3, and amplifier 106 and transistor 108 are reconnected to current mirror 104 via switch 306. Amplifier 106 therefore resumes providing current for current mirror 104.

In examples herein, an oscillator may switch from internal-resistor mode to external-resistor mode using a multi-phase transition. The multi-phase transition allows a smooth glitch-free transition with a controlled oscillator frequency. The oscillator remains stable and functional during the transition.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A circuit comprising:
an amplifier;
a transistor coupled to the amplifier;
a first switch having a first terminal and a second terminal, the first terminal coupled to the amplifier and to the transistor, the second terminal coupled to a pin, the pin configured to couple to an external circuit;
a second switch coupled to the amplifier, to the transistor, and to a first resistor, wherein the first resistor has a first terminal coupled to the second switch and a second terminal coupled to ground; and
a third switch having a first terminal and a second terminal, the first terminal of the third switch coupled to the second terminal of the first switch and the pin, the second terminal of the third switch coupled to a second resistor.

2. The circuit of claim 1, further comprising:
a set of switches having a first terminal coupled to a current mirror and a second terminal coupled to the transistor.

3. The circuit of claim 1, further comprising:
a set of switches having a terminal coupled to an input of the amplifier.

4. The circuit of claim 1, further comprising a bias current source and a fourth switch having a first terminal coupled to the bias current source and a second terminal coupled to a current mirror.

5. The circuit of claim 1, wherein the transistor comprises a control input and a current terminal, wherein the control input is coupled to an output of the amplifier, and the current terminal is coupled to an input of the amplifier.

6. The circuit of claim 1, wherein the second switch couples the first resistor to the amplifier during an internal-resistor mode.

7. The circuit of claim 1, wherein the first switch is configured to couple the amplifier to the external circuit during an external-resistor mode.

8. The circuit of claim 1, wherein the second resistor is configured to provide a charging voltage.

9. A system, comprising:
a first circuit, comprising:
a current mirror;
an amplifier;
a transistor coupled to the current mirror and to the amplifier;
a first switch having a first terminal coupled to the transistor; and
a second switch coupled between a charging resistor and the first switch; and
a second circuit comprising a resistor and a capacitor coupled in parallel, the second circuit coupled to a second terminal of the first switch of the first circuit.

10. The system of claim 9, further comprising:
a third switch coupled to the amplifier, to the transistor, and to an internal resistor.

11. The system of claim 9, further comprising a set of switches having a terminal coupled to a terminal of the transistor.

12. The system of claim 9, further comprising a third switch having a first terminal coupled to the current mirror and having a second terminal coupled to a bias current generator.

13. A method, comprising:
disconnecting an internal resistor of an oscillator chip;
connecting an external resistor to the oscillator chip; and
responsive to connecting the external resistor, connecting an external capacitor to a voltage, the external capacitor coupled to the external resistor in parallel, the external capacitor and the external resistor coupled to the oscillator chip.

14. The method of claim 13, wherein connecting the external capacitor to the voltage comprises activating a switch to connect the external capacitor to the voltage.

15. The method of claim 13, further comprising:
providing a bias current to a current mirror with a bias current source; and
responsive to connecting the external capacitor, disconnecting the bias current source from the current mirror.

16. The method of claim 15, wherein the current mirror is configured to provide a current to oscillator circuitry.

17. The method of claim 13, further comprising:
responsive to connecting the external capacitor, connecting an amplifier to a current mirror.

18. The method of claim 17, wherein the amplifier and the external resistor are configured to provide a current to the current mirror.

19. The method of claim 13, wherein a push-pull amplifier is configured to charge the external capacitor.

20. The method of claim 13, wherein disconnecting the internal resistor comprises switching an oscillator from an internal-resistor mode to an external-resistor mode.

* * * * *